United States Patent
Chen et al.

(10) Patent No.: US 8,546,917 B2
(45) Date of Patent: Oct. 1, 2013

(54) ELECTROSTATIC DISCHARGE PROTECTION HAVING PARALLEL NPN AND PNP BIPOLAR JUNCTION TRANSISTORS

(75) Inventors: Hsin-Liang Chen, Taipei (TW);
Wing-Chor Chan, Hsinchu (TW);
Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 148 days.

(21) Appl. No.: 13/073,848

(22) Filed: Mar. 28, 2011

(65) Prior Publication Data

US 2012/0248574 A1   Oct. 4, 2012

(51) Int. Cl.
*H01L 27/082*  (2006.01)
*H01L 21/8249* (2006.01)
*H01L 21/8224* (2006.01)
*H01L 21/331*  (2006.01)

(52) U.S. Cl.
USPC ........... 257/569; 438/234; 438/235; 438/236; 438/336; 438/362

(58) Field of Classification Search
USPC ........... 438/336, 362; 257/E27.053, E27.054
See application file for complete search history.

(56) References Cited

U.S. PATENT DOCUMENTS

| 2006/0091464 A1* | 5/2006 | Hiraoka | 257/355 |
| 2009/0026493 A1* | 1/2009 | Hiraoka | 257/173 |
| 2009/0283831 A1* | 11/2009 | Mallikarjunaswamy | 257/355 |

* cited by examiner

*Primary Examiner* — Kevin Parendo
(74) *Attorney, Agent, or Firm* — McClure, Qualey & Rodack, LLP

(57) ABSTRACT

A semiconductor structure and a manufacturing method and an operating method for the same are provided. The semiconductor structure comprises a first well region, a second well region, a first doped region, a second doped region, an anode, and a cathode. The second well region is adjacent to the first well region. The first doped region is on the second well region. The second doped region is on the first well region. The anode is coupled to the first doped region and the second well region. The cathode is coupled to the first well region and the second doped region. The first well region and the first doped region have a first conductivity type. The second well region and the second doped region have a second conductivity type opposite to the first conductivity type.

13 Claims, 4 Drawing Sheets

US 8,546,917 B2

ELECTROSTATIC DISCHARGE PROTECTION HAVING PARALLEL NPN AND PNP BIPOLAR JUNCTION TRANSISTORS

BACKGROUND

1. Technical Field

The disclosure relates in general to a semiconductor structure and a manufacturing method and an operating method for the same, and more particularly to a semiconductor structure having an NPN BJT and a PNP BJT connected in parallel and a manufacturing method and an operating method for the same.

2. Description of the Related Art

The electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor integrated circuit, the semiconductor integrated circuit is usually damaged. Thus, the ESD protection device between power lines has to provide a discharge path to prevent the semiconductor integrated circuit from being damaged when the high-voltage (HV) electrostatic charges are generated in the semiconductor integrated circuit.

However, the conventional ESD protection device needs an additional big design area and an additional process. Thus, the cost is increased. Referring to FIG. 1, for example, a PNP BJT and an NPN BJT are electrically connected in series in a conventional silicon controlled rectifier (SCR). In addition, latch up easily occurs during a normal operation for the conventional ESD protection device having a low holding voltage.

SUMMARY

A semiconductor structure is provided. The semiconductor structure comprises a first well region, a second well region, a first doped region, a second doped region, an anode, and a cathode. The second well region is adjacent to the first well region. The first doped region is on the second well region. The second doped region is on the first well region. The anode is coupled to the first doped region and the second well region. The cathode is coupled to the first well region and the second doped region. The first well region and the first doped region have a first conductivity type. The second well region and the second doped region have a second conductivity type opposite to the first conductivity type.

A manufacturing method for a semiconductor structure is provided. The method comprises following steps. A first well region and a second well region adjacent to each other are formed. A first doped region is formed on the second well region. A second doped region is formed on the first well region. An anode is coupled to the first doped region and the second well region. A cathode is coupled to the first well region and the second doped region. The first well region and the first doped region have a first conductivity type. The second well region and the second doped region have a second conductivity type opposite to the first conductivity type.

An operating method for a semiconductor structure is provided. The method comprises following steps. The semiconductor structure is provided. The semiconductor structure comprises a first well region, a second well region, a first doped region, and a second doped region. The second well region is adjacent to the first well region. The first doped region is on the second well region. The second doped region is on the first well region. The first well region and the first doped region have a first conductivity type. The second well region and the second doped region have a second conductivity type opposite to the first conductivity type. A first BJT having a first element type and formed by the second well region, the first well region and the second doped region is turned on. A second BJT having a second element type opposite to the first element type, and formed by the first doped region, the second well region and the first well region is turned on. The first BJT and the second BJT are electrically connected in parallel.

The following description is made with reference to the accompanying drawings.

DETAILED DESCRIPTION

Figure 1:
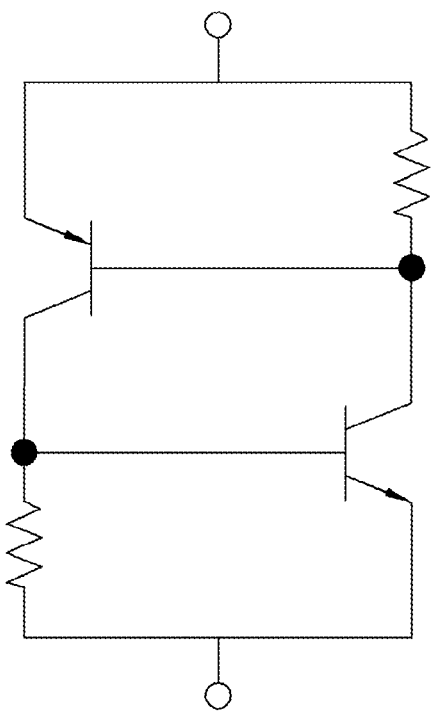
FIG. 1 illustrates an equivalent circuit of a conventional semiconductor structure.
Figure 2:
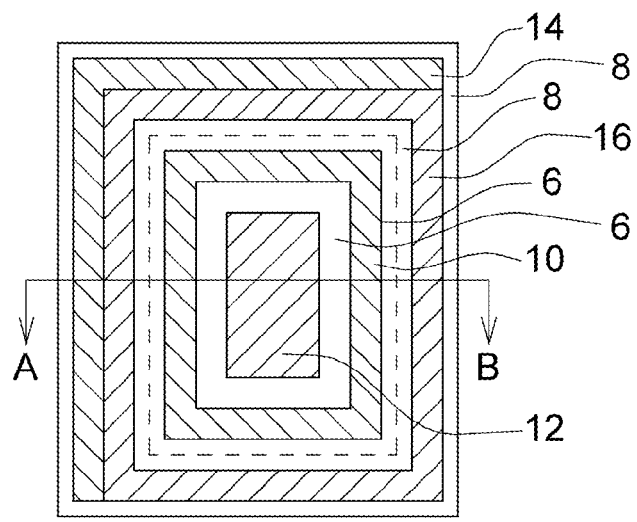
FIG. 2 illustrates a top view of the semiconductor structure according to one embodiment.
Figure 3:
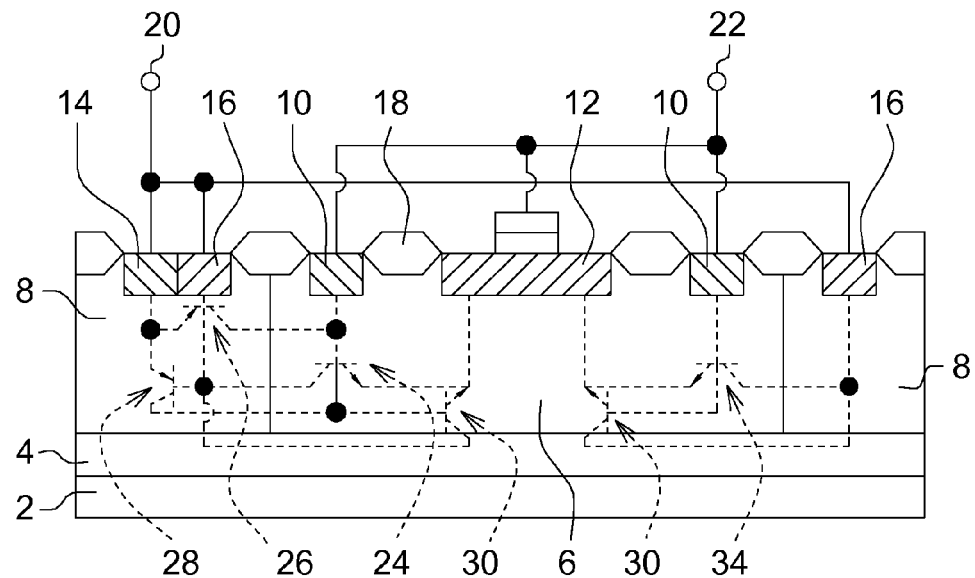
FIG. 3 illustrates a cross-section view of the semiconductor along AB line in FIG. 2.
Figure 4:
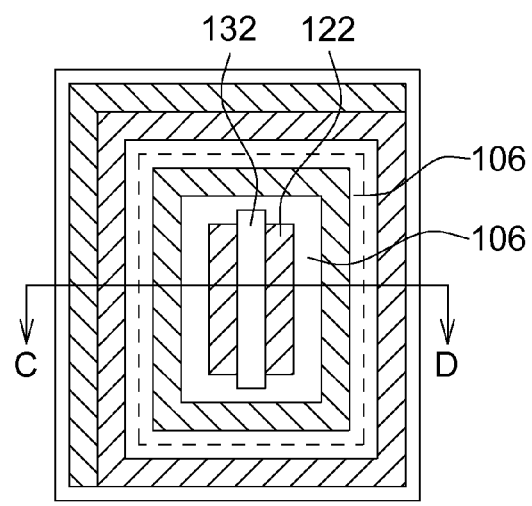
FIG. 4 illustrates a top view of the semiconductor structure according to one embodiment.
Figure 5:
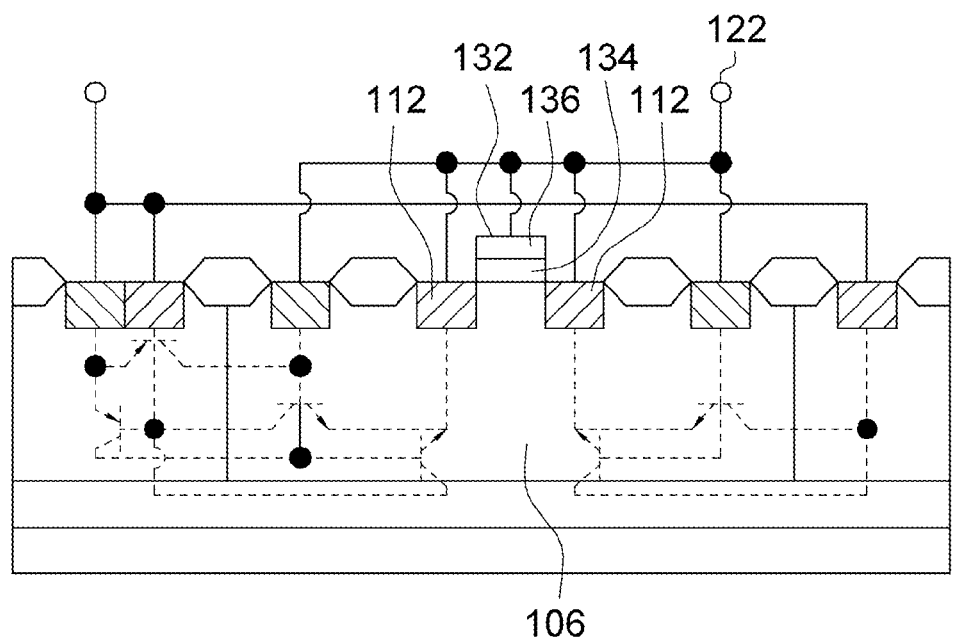
FIG. 5 illustrates a cross-section view of the semiconductor along CD line in FIG. 4.
Figure 6:
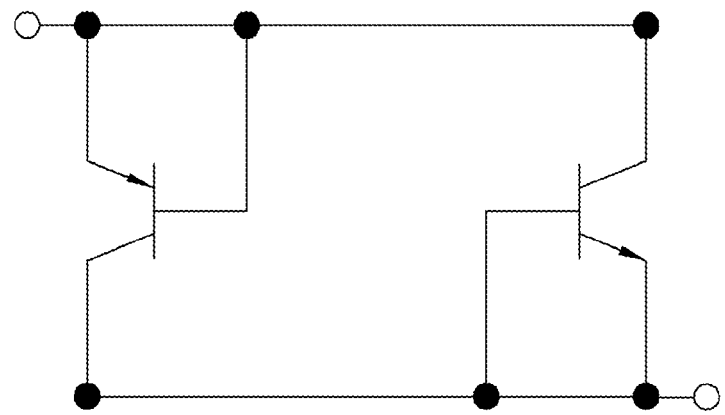
FIG. 6 illustrates an equivalent circuit of the semiconductor structure according to one embodiment.
Figure 7:
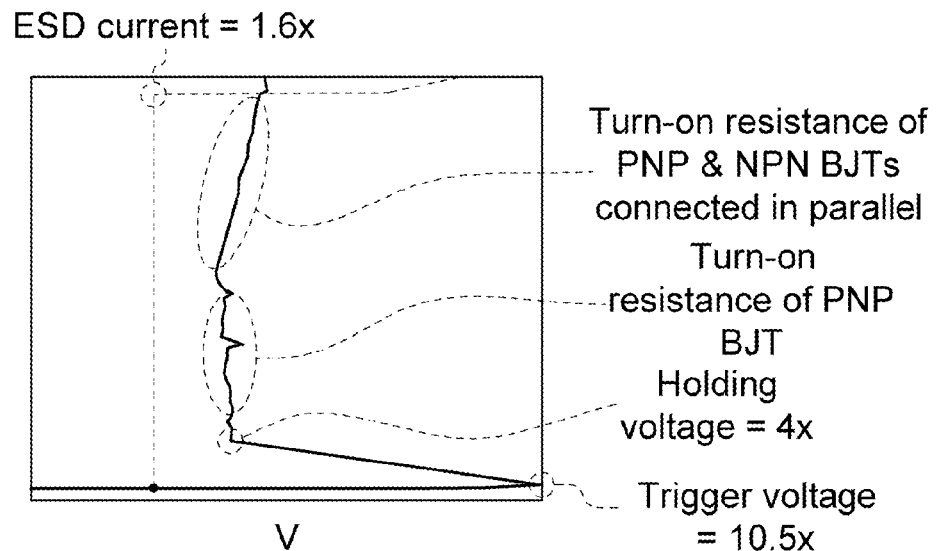
FIG. 7 illustrates an I-V curve of the semiconductor structure of one embodiment.
Figure 8:
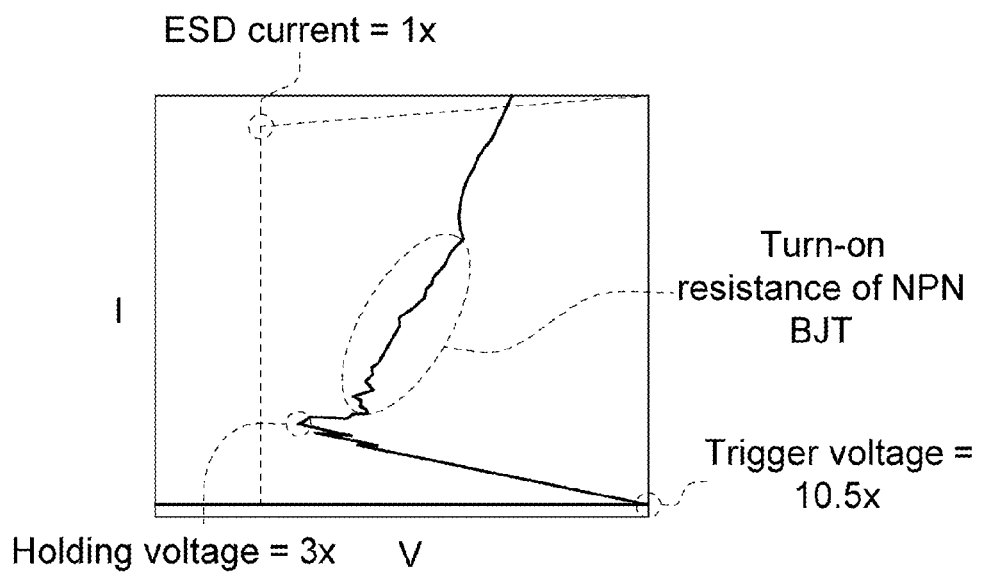
FIG. 8 illustrates an I-V curve of the semiconductor of one comparative example.

FIG. 2 illustrates a top view of the semiconductor structure according to one embodiment. FIG. 3 illustrates a cross-section view of the semiconductor along AB line in FIG. 2. FIG. 4 illustrates a top view of the semiconductor structure according to one embodiment. FIG. 5 illustrates a cross-section view of the semiconductor along CD line in FIG. 4. FIG. 6 illustrates equivalent circuits of the semiconductor structure according to some embodiments. FIG. 7 illustrates an I-V curve of the semiconductor structure of one embodiment. FIG. 8 illustrates an I-V curve of the semiconductor of one comparative example.

Referring to FIG. 3, the semiconductor structure comprises a substrate layer 2. The substrate layer 2 may be a bulk material such as silicon, or formed by a doping or epitaxial growth. A buried layer 4 is formed on the substrate layer 2. The buried layer 4 may be formed by a doping or epitaxial growth. The buried layer 4 may be a deep well or have multiple-layers stacked structure. In some embodiments, the buried layer 4 is omitted. A first well region 6 is formed on the buried layer 4. A second well region 8 is formed on the buried layer 4. The first well region 6 and the second well region 8 are adjacent to each other. In some embodiments, for example, the first well region 6 and the second well region 8 are formed, respectively, by doping the substrate material exposed by a mask layer (not shown) formed on the substrate material, and after the doping, the mask layer is removed.

An insulating element 18 is formed on the first well region 6 and the second well region 8. The insulating element 18 is not limited to the LOCOS as shown in FIG. 3. In some embodiments, the insulating element 18 can also be a STI. The insulating element 18 may comprise an oxide such as silicon oxide.

A first doped region 14 is formed on the second well region 8. A second doped region 12 is formed on the first well region 6. A third doped region 10 is formed on the first well region 6. A fourth doped region 16 is formed on the second well region 8. In some embodiments, for example, first doped region 14, the second doped region 12, the third doped region 10 and the fourth doped region 16 are formed, respectively, by doping the substrate material, such as the first well region 6 and the second well region 8, exposed by a mask layer (not shown) formed on the substrate material, and after the doping, the mask layer is removed. In one embodiment, the first doped region 14 is adjacent to a portion of the fourth doped region 16 as shown in FIG. 2.

Referring to FIG. 3, in some embodiment, the substrate layer 2, first well region 6, the third doped region 10 and the first doped region 14 have a first conductivity type. In addition, the buried layer 4, second well region 8, second doped region 12, and the fourth doped region 16 have a second conductivity type opposite to the first conductivity type. For example, the first conductivity type is P type, and the second conductivity type is N type. The dopant concentration of the first well region 6 may be higher than the dopant concentration of the substrate layer 2. The dopant concentrations of the third doped region 10 and the first doped region 14 may be higher than the dopant concentration of the first well region 6, respectively. The dopant concentrations of the buried layer 4, second doped region 12 and the fourth doped region 16 may be higher than the dopant concentration of the second well region 8, respectively.

Referring to FIG. 3, in one embodiment, an anode 20 is coupled to the first doped region 14, and also coupled to the fourth doped region 16, the second well region 8 and the buried layer 4. In addition, a cathode 22 is coupled to the second doped region 12 and also coupled to the third doped region 10 and the first well region 6.

Referring to FIG. 3, in one embodiment, the second well region 8, the first well region 6 and the second doped region 12 form a first BJT (bipolar junction transistor) 24 having a first element type. The first doped region 14, the second well region 8 and the first well region 6 form second BJTs 26 and 28 having a second element type opposite to the first element type. The buried layer 4, the first well region 6 and the second doped region 12 form a third BJT 30 having the first element type. For example, the first element type is NPN type, and the second element type is PNP type. In other embodiment, metal oxide semiconductor transistors (MOS) having opposite types (NMOS and PMOS) and field transistor having opposite types (N type and P type) can also be used.

As shown in FIG. 3, the second well region 8, the first well region 6 and the second doped region 12 may be the collector, the base and the emitter of the first BJT 24, respectively. The first doped region 14, the second well region 8 and the first well region 6 are respectively the emitter, the base and the collector of the second BJTs 26 and 28. The first BJT 24 and the second BJT 26 are electrically connected in parallel. The first BJT 24 and the second BJT 28 are also electrically connected in parallel. The buried layer 4, the first well region 6 and the second doped region 12 are the collector, the base and the emitter of the third BJT 30.

The semiconductor structure as shown in FIG. 5 differs from the semiconductor structure as shown in FIG. 3 in that a gate 132 is formed on the first well region 106 between two the second doped region 112. The gate 132 comprises a dielectric layer 134 and an electrode layer 136 formed on the dielectric layer 134. The electrode layer 136 may be formed by a single poly or double poly process. In addition, the electrode layer 136 is coupled to the cathode 122.

The semiconductor structure can be used as an ESD device. The NPN BJT and the PNP BJT are incorporated into one ESD device. Therefore, the metal wiring and the ESD device layout area are reduced. The total design area for the semiconductor structure in embodiments is smaller a conventional ESD device. The semiconductor structure has no field plate effect, and thus is insensitive to routing. The semiconductor structure can be manufactured by a standard BCD process. Therefore, an additional mask or process is not need. The semiconductor structure of embodiments can be applied to any suitable process and operation voltage (HV or LV device), such as a general DC circuit operation.

In embodiments, the equivalent circuit of the semiconductor structure has first BJT and the second BJT electrically connected in parallel, as shown in FIG. 6.

In an operating method, the first BJT and the second BJT are turned on by a stage by stage method for high voltage ESD protection structure. For example, after the NPN BJT is triggered and turned on, the PNP BJT is turned on. As indicated in FIG. 7, during the operation, the turning on of the NPN BJT is triggered. The snap-back decision is made by the turning on of the PNP BJT. The turning-on resistance (Ron; the slop of the I-V curve) of the ESD device is obtained after the snap-back decision. The ESD current, discharged by the turned-on NPN BJT and PNP BJT at the same time, is high. The Ron of the semiconductor structure of the embodiment as indicated in FIG. 7 is smaller than the Ron of the comparative example having a conventional NPN BJT as indicated in FIG. 8. The cell pitch of the semiconductor structure of the embodiment is reduced by 53.24% as compared to that of the comparative example. The holding voltage and the second breakdown trigger current are improved by 21.14% and 60.12%, respectively, as compared to that of the comparative example. In other embodiments, the device can be early turned on by an additional bias to the gate or base.

In embodiments, the breakdown voltage of the semiconductor structure is close to the HV device operation voltage. The trigger voltage is lower than the breakdown voltage of the HV device. The holding voltage is high. Therefore, for example, it is easier to avoid latching up for the semiconductor structure of the embodiment than a conventional silicon controlled rectifier (SCR).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
a substrate layer;
a buried layer formed on the substrate layer;
a first well region formed on the buried layer;
a second well region formed on the buried layer and adjacent to the first well region;
a first doped region on the second well region;
a second doped region on the first well region;
a third doped region on the first well region;
a fourth doped region on the second well region;
an anode coupled to the first doped region, the fourth doped region, the second well region and the buried layer; and a cathode coupled to the second doped region, the third doped region and the first well region, wherein, the substrate, the first well region, the first doped region and the third doped region have a first conductivity type, the buried layer, the second well region, the second doped region and the fourth doped region have a second conductivity type opposite to the first conductivity type, the second well region, the first well region and the second doped region form a first BJT having a first element type, the first doped region, the second well region and the first well region form a second BJT having a second element type opposite to the first element type, the first BJT and the second BJT are electrically connected in parallel.

2. The semiconductor structure according to claim 1, wherein the first element type is NPN type, the second element type is PNP type.

3. The semiconductor structure according to claim 1, wherein, the second well region is a collector of the first BJT, the first well region is a base of the first BJT, the second doped region is an emitter of the first BJT, the first doped region is an emitter of the second BJT, the second well region is a base of the second BJT, the first well region is a collector of the second BJT.

4. The semiconductor structure according to claim 1, wherein the buried layer is coupled to the anode, and wherein the buried layer, the first well region and the second doped region form a third BJT having the first element type.

5. The semiconductor structure according to claim 4, wherein the buried layer is a collector of the third BJT, the first well region is a base of the third BJT, and the second doped region is an emitter of the third BJT.

6. The semiconductor structure according to claim 1, further comprising:

another second doped region; and a gate comprising a dielectric layer and an electrode layer on the dielectric layer, wherein the gate is disposed on the first well region between the second doped region and the another second doped region, the electrode layer is coupled to the cathode.

7. The semiconductor structure according to claim 1, wherein the first conductivity type is P type, the second conductivity type is N type.

8. A manufacturing method for a semiconductor structure, comprising:

providing a substrate layer;

forming a buried layer on the substrate layer;

forming a first well region and a second well region on the buried layer and adjacent to each other;

forming a first doped region on the second well region;

forming a second doped region on the first well region;

forming a third doped region on the first well region;

forming a fourth doped region on the second well region;

coupling an anode to the first doped region, the fourth doped region, the second well region and the buried layer; and coupling a cathode to the second doped region, the third doped region and the first well region, wherein, the substrate, the first well region, the first doped region and the third doped region have a first conductivity type, the buried layer, the second well region, the second doped region and the fourth doped region have a second conductivity type opposite to the first conductivity type, the second well region, the first well region and the second doped region form a first BJT having a first element type, the first doped region, the second well region and the first well region form a second BJT having a second element type opposite to the first element type, the first BJT and the second BJT are electrically connected in parallel.

9. The manufacturing method for the semiconductor structure according to claim 8, wherein the semiconductor structure comprises another second doped region on the first well region, further comprising:

forming a dielectric layer on the first well region between the second doped region and the another second doped region;

forming an electrode layer on the dielectric layer; and coupling the cathode to the electrode layer.

10. An operating method for a semiconductor structure, comprising:

providing the semiconductor structure comprising:

a substrate layer;

a buried layer formed on the substrate layer;

a first well region formed on the buried layer;

a second well region formed on the buried layer and adjacent to the first well region;

a first doped region on the second well region;

a second doped region on the first well region;

a third doped region on the first well region; and a fourth doped region on the second well region;

wherein the substrate, the first well region, the first doped region and the third doped region have a first conductivity type, and wherein the buried layer, the second well region, the second doped region and the fourth doped region have a second conductivity type opposite to the first conductivity type;

coupling an anode to the first doped region, the fourth doped region, the second well region and the buried layer;

coupling a cathode to the second doped region, the third doped region and the first well region;

turning on a first BJT having a first element type and formed by the second well region, the first well region and the second doped region; and turning on a second BJT having a second element type opposite to the first element type, and formed by the first doped region, the second well region and the first well region, wherein the first BJT and the second BJT are electrically connected in parallel.

11. The operating method for the semiconductor structure according to claim 10, wherein the second BJT is turned on after the first BJT is turned on.

12. The operating method for the semiconductor structure according to claim 10, wherein the first element type is NPN type, the second element type is PNP type.

13. The operating method for the semiconductor structure according to claim 10, wherein the first conductivity type is P type, the second conductivity type is N type.

* * * * *